(12) United States Patent
Jonczyk et al.

(10) Patent No.: US 10,633,765 B2
(45) Date of Patent: Apr. 28, 2020

(54) METHOD FOR MAINTAINING CONTAINED VOLUME OF MOLTEN MATERIAL FROM WHICH MATERIAL IS DEPLETED AND REPLENISHED

(71) Applicant: 1366 TECHNOLOGIES, INC., Bedford, MA (US)

(72) Inventors: Ralf Jonczyk, Concord, MA (US); Richard L Wallace, Acton, MA (US); David S Harvey, Billerica, MA (US)

(73) Assignee: 1366 TECHNOLOGIES, INC., Bedford, MA (US)

( * ) Notice: Subject to any disclaimer, the term of this patent is extended or adjusted under 35 U.S.C. 154(b) by 174 days.

(21) Appl. No.: 15/566,785

(22) PCT Filed: Apr. 28, 2016

(86) PCT No.: PCT/US2016/029720
§ 371 (c)(1),
(2) Date: Oct. 16, 2017

(87) PCT Pub. No.: WO2016/176418
PCT Pub. Date: Nov. 3, 2016

(65) Prior Publication Data
US 2018/0119309 A1    May 3, 2018

Related U.S. Application Data

(60) Provisional application No. 62/154,383, filed on Apr. 29, 2015.

(51) Int. Cl.
*C03B 35/00* (2006.01)
*C30B 35/00* (2006.01)
(Continued)

(52) U.S. Cl.
CPC ............ *C30B 35/007* (2013.01); *C30B 11/08* (2013.01); *C30B 29/06* (2013.01); *C30B 29/08* (2013.01); *C30B 35/002* (2013.01); *C30B 15/10* (2013.01)

(58) Field of Classification Search
CPC .............................. C03B 35/007; C03B 15/10
See application file for complete search history.

(56) References Cited

U.S. PATENT DOCUMENTS 4,853,076 A    8/1989  Tsaur et al.
6,361,597 B1   3/2002  Takase et al.
(Continued)

FOREIGN PATENT DOCUMENTS

CN      1163949 A      11/1997
CN    101649486 A       2/2010
(Continued)

OTHER PUBLICATIONS

Machine English Language translation of JP 2013/079800 A Dec. 2013 (Year: 2013).*
(Continued)

*Primary Examiner* — Scott R Kastler
(74) *Attorney, Agent, or Firm* — The Marbury Law Group, PLLC

(57) ABSTRACT

A main crucible of molten semiconductor is replenished from a supply crucible maintained such that there are always two phases of solid and liquid semiconductor within the supply crucible. Heat added to melt the solid material results in the solid material changing phase to liquid, but will not result in any significant elevation in temperature of the liquid within the supply crucible. The temperature excursions are advantageously small, being less than that which would cause problems with the formed product. The solid product material acts as a sort of temperature buffer, to (Continued)

maintain the supply liquid temperature automatically and passively at or very near to the phase transition temperature. For silicon, excursions are kept to less than 90° C., and even as small as 50° C. The methods also are useful with germanium. Prior art silicon methods that entirely melt the semiconductor experience excursions exceeding 100° C.

29 Claims, 6 Drawing Sheets

(51) Int. Cl.
*C30B 29/08* (2006.01)
*C30B 11/08* (2006.01)
*C30B 29/06* (2006.01)
*C30B 15/10* (2006.01)

(56) References Cited

U.S. PATENT DOCUMENTS

| | | |
|---|---|---|
| 2009/0047203 A1 | 2/2009 | Mueller et al. |
| 2009/0151622 A1 | 6/2009 | Wilson |
| 2010/0047148 A1 | 2/2010 | Hugo |
| 2010/0116196 A1 | 5/2010 | Liu |
| 2011/0117234 A1 | 5/2011 | Kellerman et al. |
| 2012/0056135 A1 | 3/2012 | DeLuca et al. |
| 2013/0036967 A1 | 2/2013 | Sachs et al. |
| 2014/0027430 A1 | 1/2014 | Stoddard |
| 2015/0090178 A1 | 4/2015 | Arvidson et al. |
| 2018/0119309 A1* | 5/2018 | Jonczyk ............ C30B 29/08 |

FOREIGN PATENT DOCUMENTS

| | | |
|---|---|---|
| CN | 101798705 A | 8/2010 |
| CN | 103249875 A | 8/2013 |
| JP | H11-255589 A | 9/1999 |
| JP | 2008195601 A | 8/2008 |
| JP | 2009263174 A | 11/2009 |
| JP | 2010070404 A | 4/2010 |
| JP | 2012-508153 A | 4/2012 |
| JP | 2013079800 A | 5/2013 |
| TW | 201009136 A | 3/2010 |
| TW | 201404955 A | 2/2014 |
| WO | WO2008087949 A1 | 7/2008 |
| WO | WO2010-104838 A1 | 9/2010 |
| WO | WO2015021397 A1 | 2/2015 |

OTHER PUBLICATIONS

International Search Report for International Patent Application No. PCT/US2016/029720, dated Apr. 28, 2016, 2 pages.
Written Opinion of the International Searching Authority for International Patent Application No. PCT/US2016/029720, dated Jul. 29, 2016, 8 pages.
International Preliminary Report on Patentability for International Patent Application No. PCT/US2016/029720, dated Oct. 31, 2017, 9 pages.
Extended European Search Report Rule 62 EPC, Supplementary European Search Report (Art. 153(7) EPC) and European Opinion for European Patent Application No. 16787126.8, dated Dec. 17, 2018, 7 pages.
Communication Pursuant to Rules 70(2) and 70a(2) EPC for European Patent Application No. 16787126.8, dated Jan. 8, 2019, 1 page.
Office Communication, First Office Action from China National Intellectual Property Administration for Chinese Patent Application for Invention No. 201680038649.X, dated Sep. 5, 2019, 8 pages.
Office Communication and Examination Report from Taiwan Intellectual Property for Taiwanese Patent Application No. 10511418, dated Jan. 7, 2020, 9 pages.
Office Communication from Japan Patent Office for Japanese Patent Application No. 2017-556665, dated Feb. 12, 2020, 7 pages.
Office Communication and First Examination Report from the Patent Office Intellectual Property India for India Patent Application No. 201737035372, dated Feb. 6, 2020, 8 pages.
Office Communication, Second Office Action from China National Intellectual Property Administration for Chinese Patent Application for Invention No. 201680038649.X, dated Mar. 16, 2020, 6 pages.

* cited by examiner

METHOD FOR MAINTAINING CONTAINED VOLUME OF MOLTEN MATERIAL FROM WHICH MATERIAL IS DEPLETED AND REPLENISHED

RELATED DOCUMENT

Priority is claimed to U.S. Provisional Patent Application No. 62/154,383, filed on Apr. 29, 2015, inventors Jonczyk et al., entitled TWO PHASE CONTINUOUS MELT REPLENISHMENT FOR CRYSTAL GROWTH, Applicant 1366 Technologies, Inc., of Bedford, Mass., the complete disclosure of which is hereby incorporated by reference.

BACKGROUND

A semiconductor wafer can be formed directly from a semiconductor melt, generally using techniques disclosed in U.S. Pat. No. 8,293,009, issued on Oct. 23, 2012, entitled METHODS FOR EFFICIENTLY MAKING THIN SEMICONDUCTOR BODIES FROM MOLTEN MATERIAL FOR SOLAR CELLS AND THE LIKE, by Sachs, et al., which is fully incorporated herein by reference). The technology disclosed in this patent is referred to herein generally as Direct Wafer® (DW) wafer forming technology. According to this technology, a thin semi-conductor body, such as a wafer, is formed from a melt of semi-conductor material, rather than being sawn from an ingot, or grown between strings, or some other method. The U.S. Pat. No. 8,293,009 is referred to herein at times below as the DW Patent or the Direct Wafer Patent.

Briefly, referring to FIGS. 1-4 (which are annotated versions of figures from the prior art DW Patent), according to the Direct Wafer (DW) wafer forming technology, a pressure differential is applied across a porous forming member 5 and a semiconductor (e.g. silicon) wafer 19 is formed thereon directly from the volume 13 of molten material. Relaxation of the pressure differential allows release of the wafer 19 (as shown in FIG. 4). The forming member 5 (sometimes referred to in the DW patent and herein as a mold sheet) may be cooler than the melt 13. (The terms mold and sheet are appropriate for the specific discussion of the Direct Wafer Technology, particularly as it was introduced. However, in connection with inventions described herein, which can be used with non-molding applications, and in which the machine element upon which items are formed from the liquid material can be other than a sheet, it is beneficial to use more general terms. Thus, elements analogous to the item 5 referred to as a mold sheet in the DW Patent are referred to herein as a forming member, or forming element.) Heat is extracted through the thickness of the wafer 19 as it formed. The liquid and solid interface is substantially parallel to the plane of the forming member. The temperature of the solidifying body 19 is substantially uniform across its width, resulting in low stresses and dislocation density and higher crystallographic quality. The porous forming member 5 should be sufficiently permeable to allow flow of gas through it. It should not be so permeable as to allow the intrusion of molten material 13 into the openings of the porosities during the time the pressure differential is provided. Otherwise, the porosities could become clogged and the pressure differential could not be maintained. The melt can be introduced to the member by: full area contact with the top of a melt 15; traversing a partial area contact of melt with the forming member, whether horizontal or vertical, or in between; and by dipping the forming member into a melt. The grain size can be controlled by many means.

The pressure differential, sometimes referred to in the Direct Wafer technology patent and herein as the differential pressure regime, may be established by maintaining the melt surface 15 and thus the forming face 6 of the forming member 5 at atmospheric pressure and maintaining the back surface 7 of the forming member 5 at less than atmospheric pressure, as indicated by arrow 17, indicating a vacuum being drawn, or other pressure adjustment. In another embodiment differential pressure between the faces 6 and 7 of the forming member 5 is generated by venting the back face 7 of the forming member directly to atmosphere, while maintaining the atmosphere on the molten surface 15 and thus the forming face of the forming member 6 at a pressure substantially higher than local atmospheric pressure. An advantage of this embodiment is that a vacuum pump is not required. The forming face 6 and the melt surface 15 contact each other for a period of time that may be referred to as a contact duration. During at least a part of the contact duration, the differential pressure regime is provided.

Regarding the porosity of the forming member 5, in one embodiment, the porosity of the surface 6 touching the at first molten and later solidified semiconductor material, should be small enough in scale so as to make it difficult for the molten semiconductor 13 to enter into the porosities. Typically, the pore size of interest may range from 0.1 to 10.0 microns. The porosities are interconnected so that gas passing through the porous medium of the forming member typically flows in complex patterns, thus accommodating local blockages by finding circuitous paths around any blockages.

The very outer surface 6 of the porous body 5, which forms the surface that faces and contacts the surface 15 of the molten material 13, may be slightly non-planar (on a microscopic or slightly larger scale), thus allowing the molten semiconductor to touch the forming surface only at particular, although numerous and densely packed locations. With this structure, gas can flow a bit laterally between the molten material and the surface of the porous mold. This permits the suction that is provided by the differential pressure regime to apply force upon the wafer 19 surface, over a very large percentage of its area, approximately 100%. This is in contrast to a case where a smaller number of larger holes could be provided, through which holes the differential pressure could be provided, to establish an equivalent pressure differential. In the latter case, the locus of the pressure differential is confined to the relatively small surface area of the relatively small number of large holes. In contrast, in the former case, of a truly porous body, because the gas can flow laterally, the pressure differential is actually present in a much more distributed nature over the entire area of the surface 6 of the forming member 5 and attached wafer 19. The word porous is used herein to describe the former case, and not the latter.

Temperature control of the melt 13, of the forming surface 6 and heat extraction from the forming body 19 are all important to the growth of high quality multi-crystalline semiconductor, such as silicon, by making wafers directly from the melt. These factors control the nucleation and growth of the grains that form a wafer 19 directly from the melt, as well as the impurity segregation processes that influence the minority carrier lifetime and ultimately the cell efficiency. Uniformity control in these variables is especially important, both spatially, including but not limited to within the volume of the melt 13 and across the face of the forming surface 6 and temporally.

Wafers made according to the DW technology are pulled from a relatively small volume of molten semiconductor, such as silicon, held within a heated crucible 11. As wafers 19 are removed, one by one, the silicon that constitutes the wafer is removed from the melt 13. At prescribed intervals, the melt is replenished with a quantity of pre-melted silicon. As described in the DW patent 8,293,009, replenishment can happen between formation of each wafer, between formation of batches of wafers, or continuously. Adding solid silicon for replenishment to the main wafer-forming crucible would likely cause melt temperature variations, due in large part to the latent heat of fusion required to melt the solid, and would drastically limit through-put as the operators would wait for the silicon to melt before forming another wafer. Thus, this is not done. Instead, solid silicon can be pre-melted offline. A secondary crucible in which the silicon is melted offline is known in the industry as a tundish. A tundish is, in fact, a crucible. It may also be referred to herein as a secondary crucible, a feed crucible, or more typically, as a supply crucible. Typically, such supply crucibles are made of the same material as the main crucible in which the wafers are formed. Herein, the phrase tundish will typically be used to discuss prior art. The term supply crucible will be used in connection with methods of an invention hereof. It has been determined that if solid silicon is fully melted in a tundish, and poured in to the main crucible 11 at prescribed intervals, several problems arise.

First, to fully melt the silicon in a tundish and maintain the wafer output of the furnace, a large amount of heater power is sent to the tundish. This melts the silicon, but also raises the temperature of the molten silicon in the tundish to a very high temperature. When silicon at that relatively high temperature is added to the main crucible 11, temperature excursions result within the volume of the melt 13 in the main crucible 11 as well as temperature non-uniformities throughout the volume of the melt 13. These excursions and non-uniformities present challenges to growing high quality wafers.

Second, to prevent freezing of the pre-melted replenishment silicon, and to maintain the throughput rate of the furnace, the added silicon must be heated quickly far above its melting point. This results in it being at a temperature significantly above the temperature of the bulk of the molten silicon in the crucible 11. The interior of the furnace in which the crucible 11 resides is typically primarily composed of graphite. The carbon contained therein is soluble in the molten silicon. Furthermore, carbon's solubility in silicon is much higher at higher temperatures.

In addition to the furnace insulation, one must consider the composition of the crucibles. The crucibles, both supply and main, can be made from a group of materials known to be able to retain molten silicon, such as graphite, silica, silicon carbide, silicon nitride, quartz (silicon dioxide) and others. All of these materials are slightly soluble in molten silicon, with higher solubility at higher temperatures of the liquid silicon. If there is only liquid phase product material in the supply crucible, and temperature overshoots are large, crucible components, such as carbon (for graphite or silicon carbide crucibles), oxygen (for quartz crucibles), nitrogen (for silicon nitride crucibles), etc., would be dissolved at greater concentrations into the liquid semiconductor, than would arise near the melt temperature.

Too much carbon or oxygen (from the crucible, or elsewhere) in the grown wafer can cause reduced minority carrier lifetime in wafers used for solar cells. It can also cause other problems in running the furnace. These other problems can include excess precipitation of silicon carbide or excess silicon monoxide depositing in the chamber by gas transport. The increase with higher temperature is very significant. If very hot molten silicon, saturated with dissolved carbon, is added to cooler molten silicon, silicon carbide will precipitate in the melt. These precipitates compromise the quality of any wafer made from the molten silicon by the DW method. They cause poorer surface finish quality, such as a film of high impurity containing material, or inclusions or precipitates within the body of the wafer. The precipitates can also compromise quality by causing shunts through the junction and local recombination centers in the bulk of the wafer.

Third, to minimize the amount of heat required to melt feedstock without causing these high temperature excursions, an operator may attempt to use relatively smaller size feedstock particles, for instance of 1 mm-10 mm size, or smaller. However, such smaller particles have more surface area per volume, compared with larger particles. Such a larger surface area to volume ratio is undesirable, because the surface is the primary location for impurities and contaminants, and thus relatively more surface area is a source of more contamination from surface contaminants.

There are methods known in the art to minimize temperature gradients in the tundish, and they include, but are not limited to rotating the crucible or tilting it back and forth to encourage mixing, bubbling gas through the liquid to encourage mixing, and other such methods. These methods are somewhat cumbersome and require mechanically handling and manipulating or otherwise disturbing the tundish, all of which activities have costs and complexities that it would be best to avoid, if possible.

Thus, it is desired to be able to produce semiconductors directly from a melt of molten semiconductor in a crucible, and to replenish the molten semiconductor in the crucible without reducing the throughput rate of wafer production. It is further desired to be able to replenish the molten semiconductor without causing significant temperature excursions and non-uniformities, both spatial and temporal, within the molten material contained in either a supply crucible or the main crucible. Stated another way, it is desired to be able to replenish the molten semiconductor while causing only advantageously small temperature excursions and non-uniformities, both spatial and temporal, within the molten material contained in any supply crucible and the main crucible. It is further desired to be able to replenish the molten semiconductor without causing precipitates of carbides, in particular silicon carbides in the case of silicon semiconductor. It is also desirable to be able to produce semiconductors directly from a melt of molten semiconductor, which melt has been formed using feedstock of a particle size larger than 10 mm.

Thus, an object of an invention hereof is to be able to produce semiconductors directly from a melt of molten semiconductor in a crucible, and to replenish the molten semiconductor in the crucible without reducing the throughput rate of wafer production. It is further object of an invention hereof to be able to replenish the molten semiconductor without causing significant temperature excursions and non-uniformities within the molten material contained in any supply crucible or within the main crucible. An object of an invention hereof to be able to replenish the molten semiconductor while causing only advantageously small temperature excursions and non-uniformities within the molten material contained in both any supply crucible and the main crucible. It is yet another object of inventions hereof to be able to replenish the molten semiconductor without causing precipitates of carbides, in particular silicon carbides in the case of silicon semiconductor. Broader objects include, to achieve these goals in the fabrication of any object from a crucible of molten semiconductor, without giving rise to excursions and non-uniformities of temperature within the volume of molten material. Similarly, an object of inventions hereof is to replenish a melt of molten material without causing precipitates of undesirable compounds, in particular due to the replenishing material being at a significantly higher temperature than the bulk of molten material. Yet another object of inventions hereof is to produce semiconductors directly from a melt of molten semiconductor, which melt has been formed using feedstock of a particle size larger than 10 mm.

A relatively specific object of inventions hereof is to be able to produce high quality semiconductor wafers with repeatable composition, at an efficiently high throughput, directly from a crucible of molten material.

BRIEF SUMMARY

According to an aspect of an invention hereof, in conjunction with a process for forming a semiconductor wafer directly from a main crucible of molten material such as by the DW method, a supply crucible (a tundish) is maintained with supply semiconductor of the desired composition within it, under conditions of temperature and volume and composition, such that there are always the two phases of solid material and liquid material within the supply crucible. Any additional heat that is added to melt the solid material will result in the solid material changing phase to liquid, but will not result in any significant elevation in the temperature of the liquid within the supply crucible. The temperature excursions that arise are advantageously small, being less than that which would cause problems with the formed product. A detailed discussion of the dynamic situation regarding temperature excursion in the liquid contained in the supply crucible is set out below, in the Detailed Discussion portion. The energy from the added heat is taken up by the change of phase, rather than any elevation of temperature of the solid or liquid product material within the supply crucible. For silicon, the latent heat of fusion is 4.138 kJ*cm$^{-3}$. As long as some solid product material remains within the supply crucible, the temperature of any liquid product material in the supply crucible will not rise significantly. Any rise in temperature remains advantageously small. The solid product material acts as a sort of temperature buffer, to maintain the supply liquid temperature automatically and passively at or very near to the phase transition temperature. As used herein, the term product material means material that is melted and then solidified to form a product, and so the product is molded or formed in some fashion to make a product or a product pre-cursor.

Using prior art methods, a typical temperature excursion in the supply crucible above a target process temperature for silicon would be approximately 100° C. It is advantageous to be able to control the process so that temperature excursions in a supply crucible are less than this 100° C. Even if the excursions are only 10° C. less than experienced by the prior art, meaning an excursion of 90° C., such a situation would be advantageous. As used herein, for the case of a silicon system, an excursion of less than 90° C. above the process target temperature is considered to be advantageously small. Advantageously small excursions can also be characterized in terms of a multiple of the equilibrium melting temperature, as explained below.

Other semiconductor materials can also benefit from this approach. Another example is germanium, which also has a relatively high heat of fusion and melts at 938° C. Germanium systems are also discussed in more detail below.

The liquid product material can be transferred from the supply crucible to the main crucible by any suitable means. Several such means include, by illustration that is not meant to constitute an exhaustive or limiting list, increasing the height of the liquid product material in the supply crucible, by increasing power to the supply crucible heater, until liquid product material spills out over the rim of the supply crucible into the main crucible, which is arranged gravitationally below the supply crucible. Another method is to tilt the supply crucible. Another method is to displace liquid product material from the supply crucible, such as by using a solid or a gas to take up volume within the supply crucible, thereby causing the liquid product material to spill over the rim. Another method is to use a conduit or a trough from the supply crucible to the main crucible.

Using this two-phase process, for instance with silicon bodies used to fabricate solar collector panels, solid product material of n or p-doped wafers can be made from solid product material of 1 mm-15 mm size, or larger. Such a two phase method can be used to maintain the temperature and composition of a supply of replenishment liquid semiconductor material for any process that requires feedstock replenishment, which is sensitive to temperature excursions, and composition variations, as well as impurities that may be incorporated into the melt as a result of temperature excursions and impurity content in the solid replenishment material. The temperature excursions in the supply crucible above the process target temperature are maintained advantageously small.

While the methods are discussed in terms of a forming process, in which a forming surface is brought into contact with the molten semiconductor material, the methods are relevant to any method where a volume of molten material in a main vessel is depleted at intervals of time, and then replenished with more molten material, in which process it is undesirable to introduce temperature excursions to the molten material in the main vessel, and also undesirable to introduce certain types of impurities to the molten material, which ill effects are enhanced with temperature excursions.

These and other objects and aspects of inventions disclosed herein will be better understood with reference to the Figures of the Drawing, of which:

DETAILED DESCRIPTION

Figure 4:
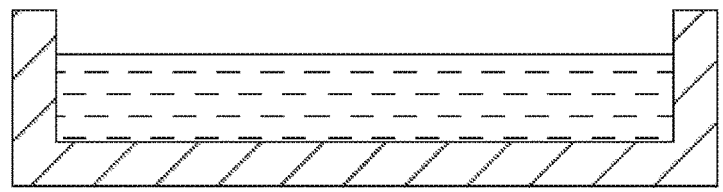
FIG. 4 is a schematic representation of the formed semiconductor body released from the prior art forming member upon release of differential pressure through the mold body.
Figure 4:
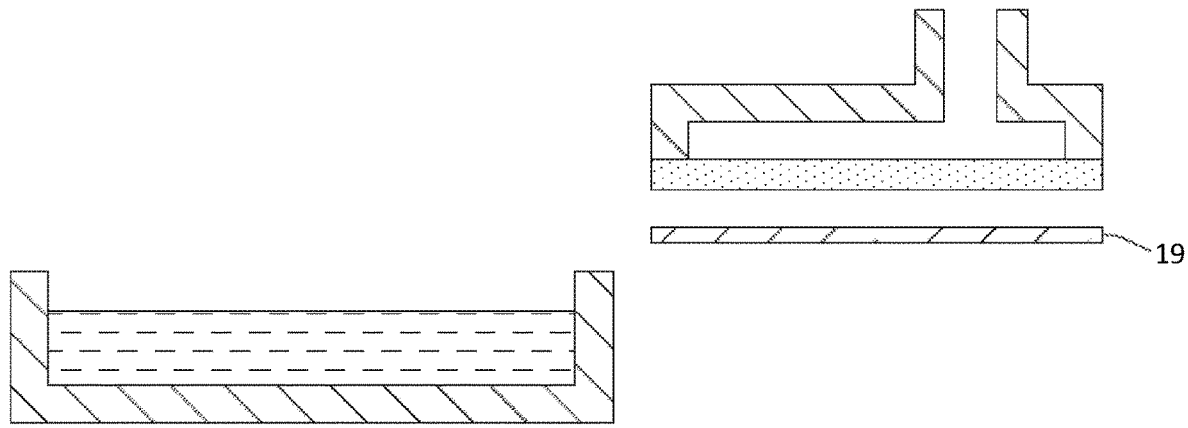
Figure 5:
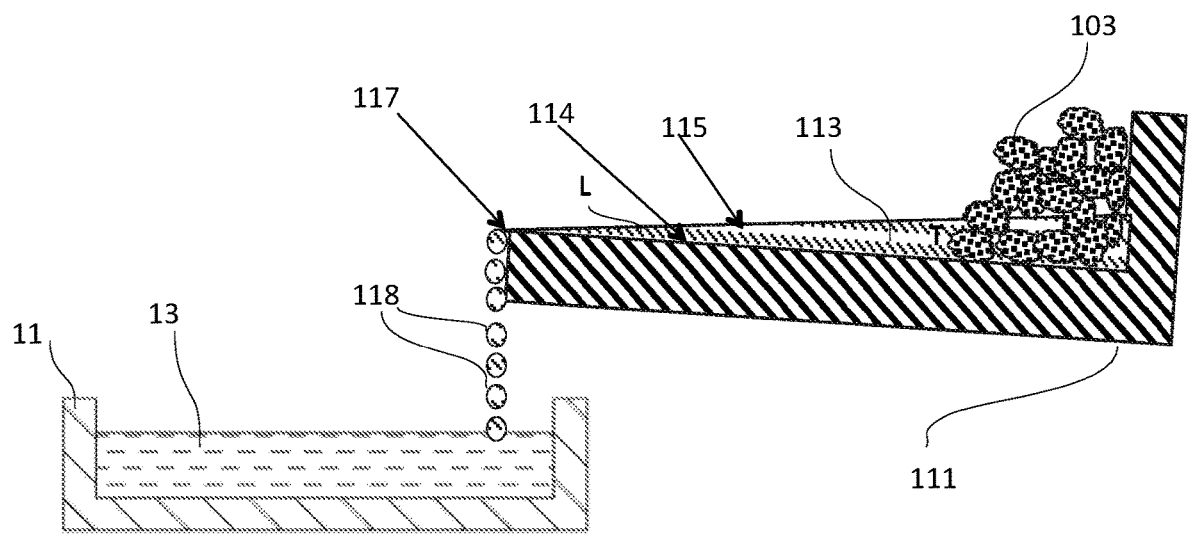
FIG. 5 is a schematic representation in cross-sectional view of an embodiment of an invention hereof, showing a main crucible containing molten material (with no formed product body shown, for clarity) and a supply crucible containing solid and liquid phases of product material, from which replenishing liquid product material is being added to the main crucible.

FIG. 5 shows, schematically, a main crucible 11 with a volume of molten product material 13 within. This is the same sort of crucible as shown in FIGS. 1-4. A forming surface and formed article are not shown, for simplifying explanation. Also, as mentioned above, process inventions hereof can be used with any molten semiconductor forming process, in which the volume of molten material in a main crucible is depleted at intervals of time, and also subsequently replenished. This might include processes where molten semiconductor is poured into molds, or poured into a stream of a process with further steps, or a process in which some sort of forming tool, such as a wick, or a wand, is dipped into the molten material, and molten material is drawn therefrom for use elsewhere. These are just examples meant to be illustrative and not limiting. The important factor is that volumes of molten material are removed from the main crucible from which a product will be made, are removed from time to time, and which volumes need to be replenished.

A supply crucible 111 (also referred to herein as a tundish, or supply tundish) is located (in this example, but it need not be) gravitationally higher than and overlapping with the main crucible 11. The supply crucible 111 and the main crucible 11 can be, and typically are, independently heated by conventional means, not shown. Semiconductor feedstock, for instance in the case of forming a silicon body, solid silicon product material 103 is fed into the shallow melt 113 within the supply crucible 111. The solid product material 103 slowly melts, to become liquid, also referred to herein as molten. The solid product material 103 is shown as chunk material. As the level of the liquid semiconductor surface 115 in the supply crucible 111 rises above the opening of the spout 117, liquid semiconductor 118 flows out of the spout 117 and into the main crucible 11, below.

As discussed below, an aspect of a method invention hereof is to maintain the product material in the supply crucible 111 in a state of two phases: some solid phase product material 103; and some liquid phase product material 113. Practitioners will recognize that the terms liquid and molten are generally synonymous, and they are intended to be so as used herein. Generally, the term liquid is used in discussions about the phases of product material. The term molten is used generally when discussing the hot, melted, molten product material, typically in the main crucible 11, but also in the supply crucible 111. Practitioners generally refer to it as molten. However, when discussing the physical phase, or state, as contrasted to solid, the state is usually referred to as liquid.

Any part of the spout 117 that extends beyond a heated zone of the supply crucible 111 can be lined with quartz, which is a poor nucleator for silicon, as an example of a semiconductor, and will allow some degree of undercooling, keeping the silicon in a liquid phase and preventing freezing to solid. (If a different semiconductor material is being used for making the product, then it is possible to use a different lining material other than quartz, which other material would have poor nucleating propensity for the other particular product semiconductor material being used.)

Figure 1:
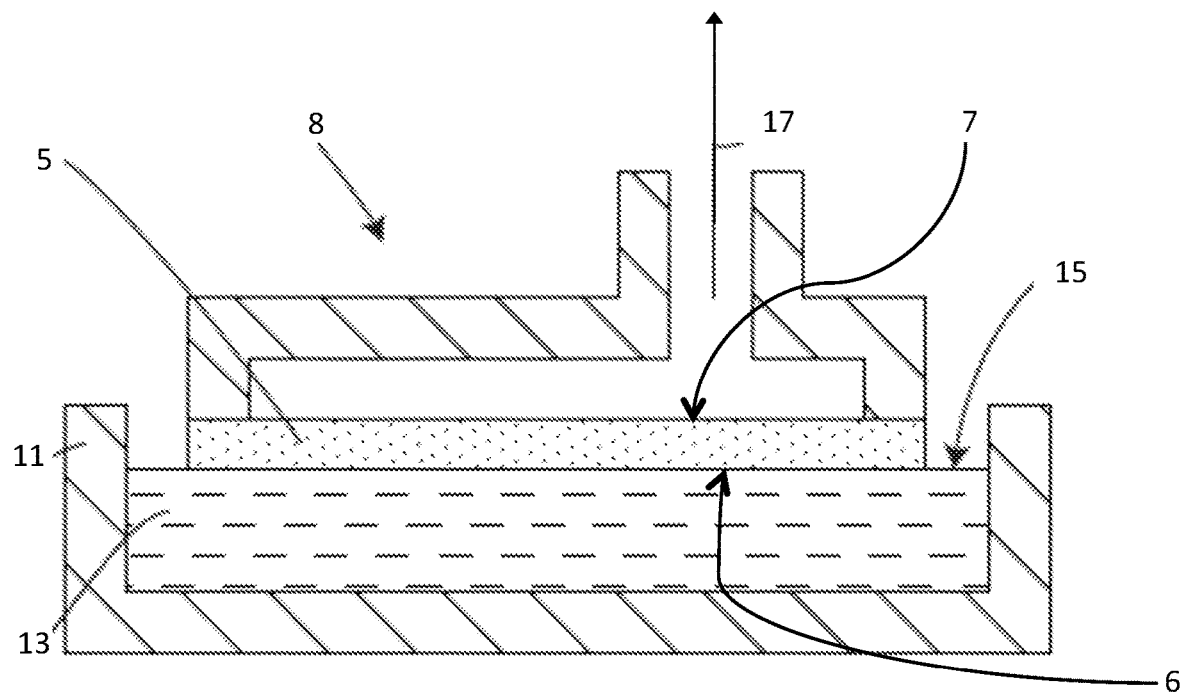
FIG. 1 is a schematic representation of a step and apparatus of a prior art process and DW apparatus and process, showing a forming member contacting a melt surface.
Figure 2:
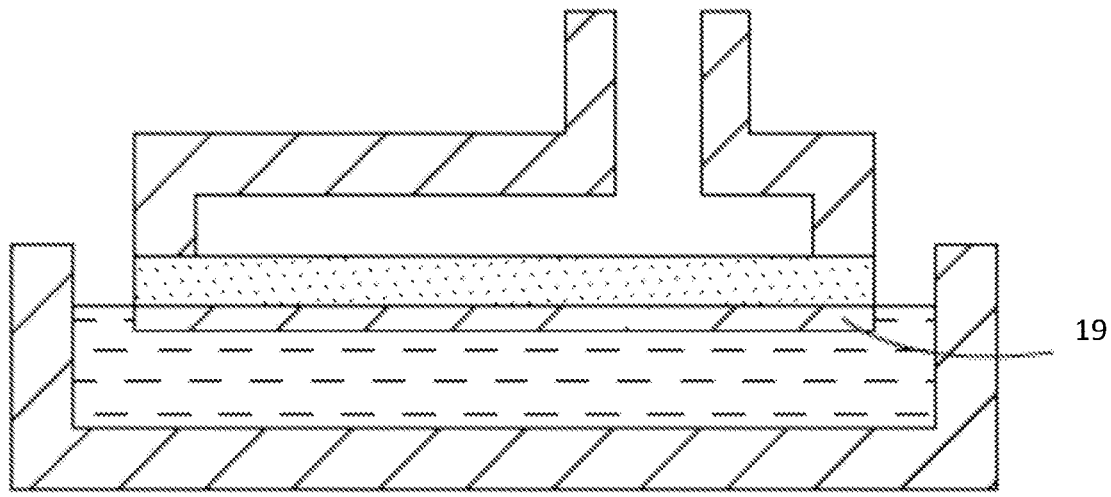
FIG. 2 is a schematic representation of a body of semiconductor formed within the melt on the prior art forming member of FIG. 1.
Figure 3:
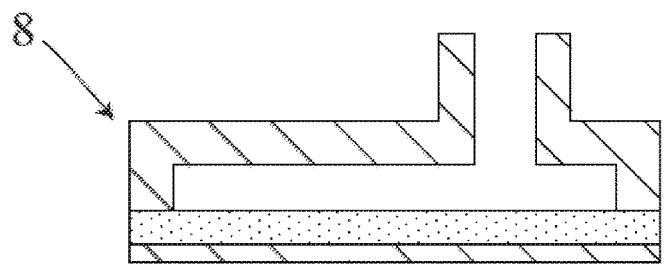
FIG. 3 is a schematic representation of the prior art forming member assembly removed from the melt with the formed solidified body attached to the forming surface.

The rate of flow, or exiting of liquid product material 118 from the supply crucible 111 should be adjusted to make up for depletion of the volume of molten material 13 in the main crucible 11, which rate will depend on how quickly the molten material 13 is depleted, based on the removal of formed objects (not shown in FIG. 5, but analogous to wafer 19 shown in FIGS. 3 and 4). It will also depend on the tolerable amount of variation in volume of molten material 13 within the main crucible 11. That rate of flow 118 exiting the supply crucible 111 can be established by any appropriate means. A pump with a meter can be provided in fluidic couple with the exit spout 117 of the supply crucible 111 and the main crucible 11.

The supply crucible 111 can be tilted at a variable angle relative to horizontal, to impel relatively more, none, or less liquid 118 to flow out of it, as needed. FIG. 5 shows the supply crucible 111 tilted, rotated slightly clockwise, as shown, from horizontal, so the bottom surface 114 of the supply crucible is inclined so that the spout is gravitationally the highest portion of the bottom surface 114. Orientation in this position, relative to a neutral horizontal position tends to impede the flow of liquid out of the spout 117. Orientation in the opposite position, with the spout being gravitationally the lowest portion of the bottom surface 114 would tend to enhance flow of liquid 118 out of the supply crucible 111. The degree of rotation can be actively controlled, by providing any suitable rotational or lifting actuator coupled to the supply crucible 111.

Or, the inclination of the supply crucible 111 can be fixed, inclined, as shown. So inclined, the control of the flow 118 of liquid exiting the supply crucible 111 can be increased by providing more liquid 113 in the supply vessel. Liquid material 118 can be made to flow out of the supply crucible 111 by providing power to heaters that heat the supply crucible, which will melt some of the solid product material 103, thereby raising the level 115 of the liquid 113 as more solid material 103 descends into the liquid material 113 because it can displace liquid product material that was just immediately previously, solid product material 103.

The temperature of the liquid 113 in the supply crucible 111 remains relatively constant as long as there is within it product material that is in both the liquid phase and the solid phase, as shown in FIG. 5, with liquid 113 and solid 103 product material being present. If there is always solid and liquid product material present, no matter how much heat energy is provided to the supply crucible 111, the temperature of the liquid 113 will remain at substantially near the melting point.

The magnitude of expected temperature excursions in the supply crucible 111 above the melting point is not simply defined or discussed. The liquid product material 113 in the supply crucible will be close to the melting temperature of the product material only in the immediate vicinity of the two-phase volume. By the immediate vicinity it is meant close to where there are both solid elements 103 and liquid volume 113 phases, such as at the location marked with the letter T. Where there is liquid only, such as at the location marked with the letter L, the temperature of the liquid product material 113 can rise to be above the equilibrium melting temperature. There would be expected to be temperature gradients in the liquid, to conduct heat to the solid product material particles 103. The presence of the two phases damps temperature excursions. The product (for instance, semiconductor wafer) making process is dynamic. Providing the two-phases of material limits thermal overshoot that would naturally occur (in the absence of replenishment of solid product material) as the last bits of solid product material were to melt.

Providing the two-phases of material also limits variability in thermal overshoot that would occur using a prior art one phase method (in the absence of replenishment of solid product material) over time, as the different portions of the process are conducted. For instance, initially after solid material is added, the temperature in the supply crucible tends to drop, as heat energy is taken up by the energy needed to change the phase of the solid material to liquid material. As less and less solid material remains, the temperature of the liquid product material rises, until more solid material is provided, at which time the temperature of the liquid product material drops again. This variability in temperature excursions above the melting temperature adds complexity to control of the system that is different from the simple difficulties of dealing with a simple constant temperature excursion of a fixed amount above the melting temperature of the product material.

The melt temperature of the semiconductor is, for instance, 1414° C. for silicon. Virtually all excess heat energy provided is taken up in the energy required to change the phase of the solid silicon material 103 into liquid silicon material 113. If the operator were to allow the solid material 103 to completely melt, then added heat provided to the at that time entirely liquid volume would, indeed, cause the temperature of the liquid 113 to increase. However, if, instead, before the solid product material 103 is entirely melted, the operator or automatic system were to add solid product material, then the temperature of the liquid product material 113 would remain substantially constant, as explained more quantitatively, below.

In practice, for a typical capacity supply crucible 111 (of 200-400 cm$^3$), using prior art methods, the temperature of the liquid product material 113 would typically raise to approximately 100° C. or more above the nominal process target temperature of approximately 1420° C. Typically, for a silicon system in which the solid supply material is completely melted, the nominal equilibrium melting temperature is 1414° C. To ensure that the liquid never freezes, which would be very detrimental to the entire process, the process aims to keep the supply liquid temperature at approximately 1420° C. To simplify discussion below, the term process target temperature will be used to mean several degrees above the equilibrium melting temperature, in the case of silicon, 6° C. above the melting temperature is typical.

Temperature excursions in a silicon system of 100° C. or more above the target process temperature are considered to be significant excursions, as that term is used herein and in the claims. Using methods of inventions disclosed herein, temperature excursions in a silicon system remain less than 90° C., and can be as small as 50° C. or even less. To describe the variety of feedstock materials or furnace configurations, it is helpful to talk about the reduction in temperature excursions with this invention in terms of a percentage reduction compared to without this invention. Therefore, using methods of inventions disclosed herein, temperature excursions are reduced by 10%, and can be as much as 50% or more.

It is advantageous to be able to control the process so that temperature excursions in a supply crucible are less than this 100° C. Even if the excursions are only 10° C. less than experienced by the prior art, meaning an excursion of 90° C., such a situation would be advantageous. As used herein, for the case of a silicon system, an excursion of less than 90° C. above the process target temperature is considered to be advantageously small. Excursions that are even less than 90° C., for instance 75° C., or 50° C. may be equally or even more advantageous. Thus, as used herein, an advantageously small temperature excursion above the process target temperature for a silicon system is one that is 90° C. or less.

It is also advantageous to limit the variability in maximum temperature excursions over time in a process, as different events occur. The prior art methods experience large variability in temperature excursions over time, with some as high as 100° C., mentioned above, and some much lower.

The dynamic temperature situation is discussed in more detail below, after discussing, in general, embodiments of methods and apparatus of inventions hereof.

Thus, one way to increase the rate of flow of liquid 118 from the supply crucible 111 to the main crucible 11 is to increase the height of the surface level 115 of the liquid 113, above the height of the spout 117, by causing more of the solid material 103 to melt, by increasing the heat energy provided to the supply crucible 111. Conversely, to reduce the rate of flow of liquid 118 from the supply crucible 111 to the main crucible 11, the operator would reduce the amount of heat energy provided to the supply crucible 111, which would reduce the rate at which the solid material 103 melts, and thus, the reduce or reverse the rate of increase in the height of the level of the surface 115 of the liquid 113 above the spout 117 level in the supply crucible 111.

An advantage of this aspect of an invention hereof is that, because of the two phase nature of the semiconductor (silicon in the primary example) in the supply crucible 111, the temperature overshoot achieved to melt the necessary amount of solid product material 103 will be minimized, as compared to a method in which all of the solid product material is melted, relatively quickly, and then used to replenish the main crucible 11. This lower temperature scenario results in relatively less dissolved carbon in the liquid product material melt replenishment stream 118. The spout 117 can also be temperature-controlled if required. The spout 117 can be heated with a separate heater and control, keeping its temperature near the temperature of the liquid 13 in the main crucible 111, to prevent freeze-ups upon pouring and also to prevent temperature excursions when the supply liquid 118 from the supply crucible 111 hits the liquid 13 within the main crucible 11.

It is important that there always be some solid product material 103 in the supply crucible 111, so that some heat energy provided to the crucible is taken up in causing the transition from solid phase to liquid phase, in which case no energy is available to raise the temperature of the liquid. Any suitable means can be used to maintain the presence of some solid product material 103.

For instance, discrete batches of equal or unequal volume can be added to the supply crucible 111 at prescribed times. Alternatively, a conveyor belt type system can be provided that delivers a relatively constant flow of solid material to the supply crucible 111.

Figure 7:
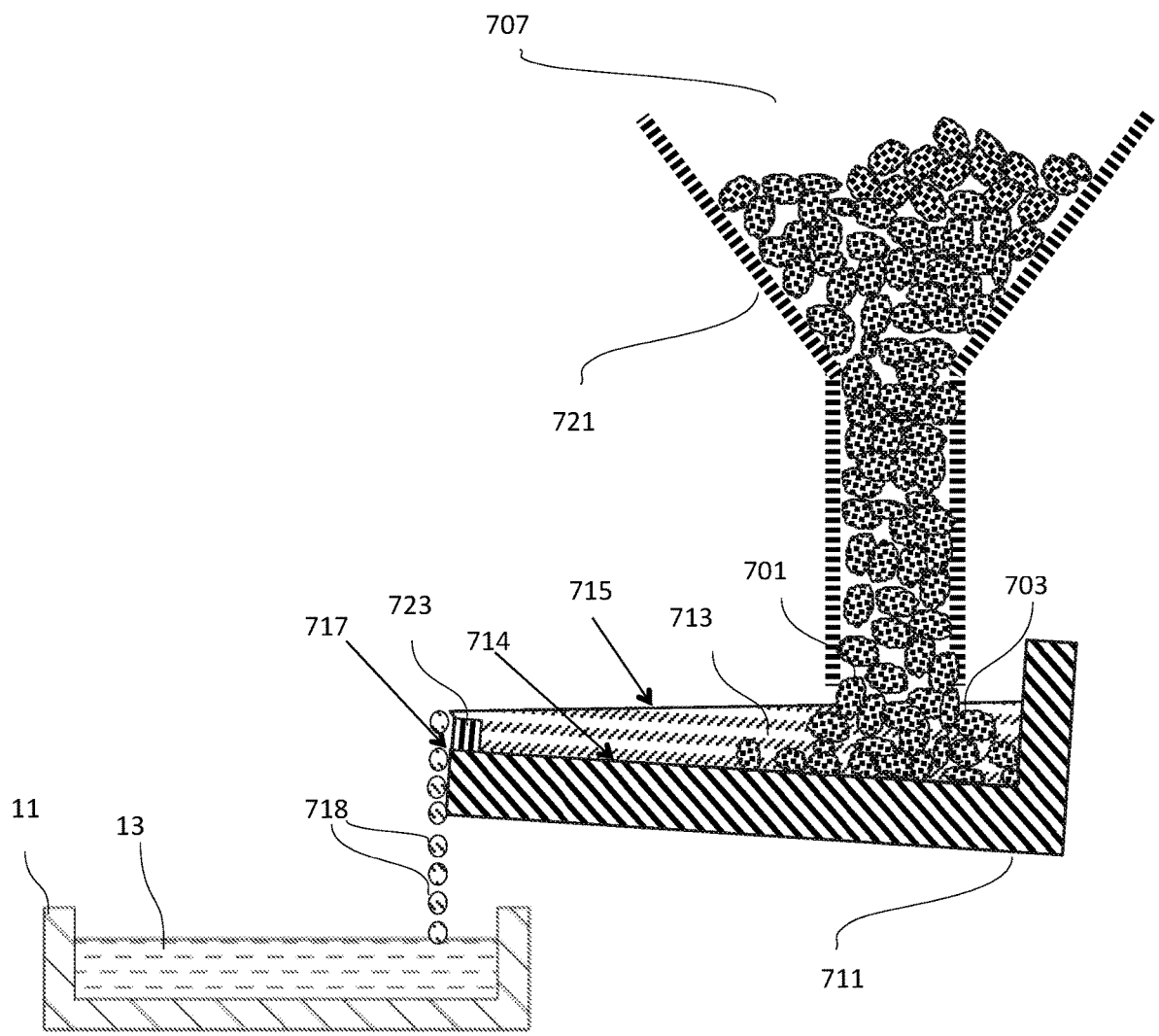
FIG. 7 is a schematic representation in cross-sectional view, of an embodiment of an invention hereof, similar to that shown in FIG. 5, showing a supply crucible containing solid and liquid phases of product material, with the solid product material retained within a funnel, and a weir at the exit of the supply crucible.

Another method, as shown schematically with reference to FIG. 7, would be to provide a relatively large volume of solid product material 703 in a holding container 721 that is shaped and arranged so that a relatively equal volume of solid material 703 is maintained in the heated supply crucible 711, which material is heated and melted at a rate that depends on the amount of heat provided to the supply crucible 711, and how much solid 703 and liquid material 713 is retained therein, among other factors.

For instance, a funnel 721 or a hopper can be provided with a relatively smaller size opening 701 within a heated zone, and a relatively larger size opening 707 gravitationally above and thermally distant from the heated supply crucible 711. The funnel is provided with a relatively large volume of solid material 703 within, some of which is in the lower heated portion, but most of which is above, in the non-heated, supply zone. The arrangement shown in FIG. 7 is advantageous because it is a passive way of adding more solid material to the supply crucible, as the pile of solid product material within the crucible body becomes depleted.

Heaters (not shown, which can be resistive or inductive or any other kind) melt the solid product material 703 within their zone of influence in a conventional manner at a rate determined by the amount of heat provided, and the solid material above the supply crucible 711 descends into the region formerly occupied by recently melted solid material 703. As liquid 718 flows out of the supply crucible 711, more room is made for the newly melted liquid, formerly solid material. A variation is shown in FIG. 7 in which a raised weir 723 is provided at the (flow-wise) leading edge 717 of the supply crucible bottom floor 714. A weir enables more liquid material 713 to be retained within the supply crucible 711 for the same rotational orientation, as compared to an embodiment without a weir, as shown in FIG. 5, without the surface 715 of the liquid level being higher than the highest part of the supply crucible leading edge 717.

The granularity of the solid product material 103 or 703, as characterized by particle size is not critical in terms of establishing relatively high product throughput, because the solid product material is melted well before (in time) it is needed to supply the main crucible 11. Thus, the particle size of the solid product material need not be small. In known systems, it is beneficial to use particles of less than about 10 mm so that it does not take too long to melt the particles, which would slow down the throughput. With the inventions disclosed herein, that size limit is not relevant. For instance, particles of size 10 mm diameter and larger can be used. In fact, particles can be used that are as large as the supply crucible 111 itself or any hopper or funnel 721 can hold and dispense into the heated regions of the supply crucible 111, 711. Using relatively larger particles 103, 703 is advantageous, because the surface to volume ratio is relatively less than with smaller particles 103, 703. Thus, the amount of any surface contaminants is less than that which would be present with nominally identical particles 103, 703 but of smaller size.

As an example, using a supply crucible having a capacity of between 200 and 400 cm$^3$, and a main crucible having a capacity of between 400 and 1100 cm$^3$, a rate of between 5 and 50 cm$^3$/min of replenishment of liquid from the supply crucible to the main crucible can be achieved. For industry standard silicon solar wafers of 156×156 mm surface area, 190 micron thick, for a volume of about 5 cm$^3$, this corresponds to between 1 and 10 wafers per minute formed from the melt 13 of the main crucible 11. For prudence, it is beneficial to maintain the amount of solid product material 103 in the supply crucible 111 above a safe minimum volume, so that all of the solid material is not unexpectedly melted, thereby allowing the temperature of the liquid product material 113 to rise unacceptably. Such a safe minimum solid volume can be determined by an operator by routine experimentation, based on variables such as the product (wafer) throughput and the geometries and thermal responses of the system.

Figure 6:
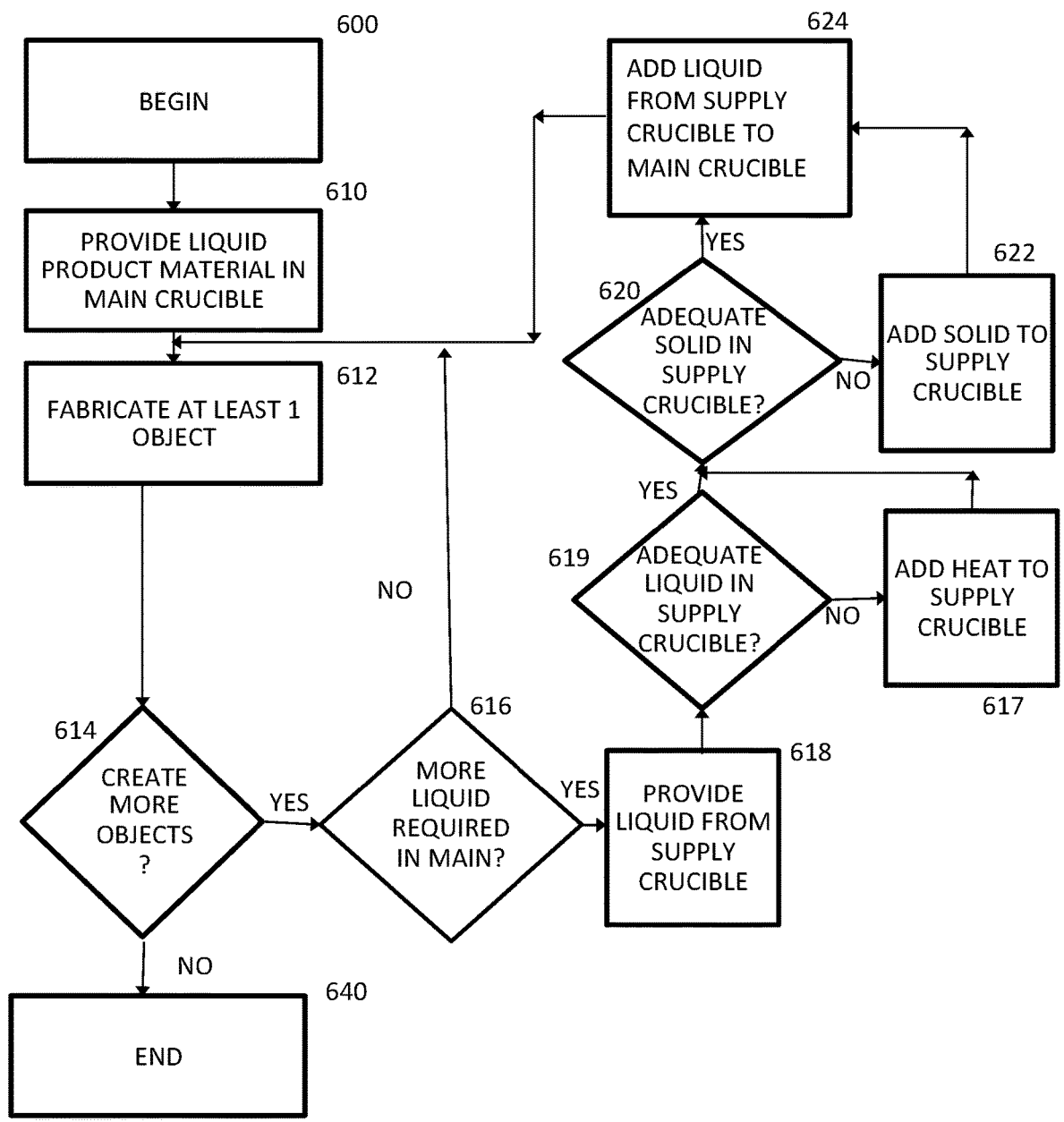
FIG. 6 shows schematically, in flow chart form, method steps of a process embodiment of an invention hereof.

The steps of method inventions hereof can also be characterized in flow chart form, as shown schematically with reference to FIG. 6. The process begins 600. Liquid product material is provided 610 in a main crucible 11. At least one fabricated object, for instance a wafer for use in solar collector panels is fabricated 612. A condition is tested 614 to determine if more objects (wafers) are to be made. If no, the process ends 640. If yes, a condition 616 is tested to determine if more liquid product material is required in the main crucible 11. If no, the process returns to 612 and an additional (wafer) object is formed, and the process continues as described above, and below. If yes, more liquid product material is required in the main crucible 11, then liquid product material is provided 618 from the supply crucible 111 to the main crucible 11. The system at this time, or continuously, determines whether two phases of product material are present, by testing a two-phase condition 620. (This may be in the form of testing to see if adequate solid phase product material is present in the supply crucible 111, or it may also be preceded by a test 619 that there is also liquid product material present. The tests for adequate liquid and adequate solid can be performed with either first, or simultaneously.) If the test 619 determines that there is not enough liquid present, heat is added 617. Returning to the condition test 620 for adequate solid phase material, if there is no solid present or if the amount of solid material is inadequate, then solid product material is added 622 to the supply crucible 111. Liquid is added 624 to the main crucible 11 from the supply crucible 111, and the method returns to 612 and at least one more object is fabricated.

Typically there is a fluid coupling of the liquid 113 in the supply crucible 111 and the main crucible 11. FIG. 5 shows this fluid couple as a simple, open pour out. The couple could also be one or more closed pipes, or open channels, or combinations of either pipes or channels and a pour out, or both pipes and channels and a pour out. The method of impelling the liquid product material 113 to leave the supply crucible 111 and make its way to the main crucible 11 can be by pumping it, or by raising the height of the surface 115 of the liquid material 113 in the supply crucible 111 higher than the spout 117 of the supply crucible, either by tilting/rotating the entire crucible itself so that the surface 115 of the liquid 113 raises, relative to the spout 117, or by displacing some of the liquid upstream of the spout, either by adding more solid product material 103, or by providing a volume of another solid that will not melt, or by pressurizing the volume of liquid 113 so that it flows, or by displacing it with another fluid, such as air or gas of some sort or any method that displaces liquid in controlled volumes. In the case of moving material by displacement, the supply crucible 111 need not be higher than the main crucible; rather the highest extent of the liquid must be above the main crucible.

Turning now to a more detailed discussion of the dynamic situation regarding the temperature in the supply crucible 111, in the prior art case where the solid product material 103 in the supply crucible 111 is melted completely before adding liquid product material 118 to the main crucible 11, the temperature excursions in the supply crucible depend on a number of variables. These variables include, but are not limited to, the rate at which the liquid product material 118 from the supply crucible 111 is withdrawn from the supply crucible 111 to be added to the main crucible 11 (which corresponds to the number and volume of products made between additions), the volume of the supply crucible 111, the control of the heater, the thermal response of the heater/crucible system, and the particle size of the solid product material 103.

Regarding the control of the heater, if there were ultimate control over the heater power and rate, and the rate and the amount of solid product material 103 added, it would be possible to give the heater just the correct amount of power, at a variable rate, such that the solid product material 103 added to the supply crucible 111 each time was just melted with minimal temperature overshoot. In practice, that would require a very complicated active control of the heaters.

In the case of fabricating products such as wafers for use in a solar cell, out of a semiconductor such as silicon, with a high heat of fusion, this approach would be further complicated by the high heat of fusion of Si (the second highest of all of the elements) as well as the mass of the system, resulting in a significant thermal lag. In practice, the two-phase methods of inventions disclosed herein, solves the temperature overshoot issue in a simpler, passive way.

Keeping the solid phase of product material 103 present in the supply crucible 111 means that excess heat supplied by the heaters results in more melting of the solid product material 103 because of the latent heat required to melt, rather than an increase in the temperature of the liquid 113 due to an increase in the sensible heat. However, because this is a dynamic process and excess heat is typically added periodically to the supply crucible 111 to increase the ratio of liquid product material 113 to solid product material 103 in a fixed amount of time, there is still a variation in temperature of the liquid product material 113 in the supply crucible 111. But these variations are mostly spatial rather than temporal. Heat is added to the supply crucible 111 to maintain its temperature, and that would cause a small gradient in temperature from the supply crucible surface 114 where it is heated to the liquid/gas and liquid/solid interfaces. These gradients would increase as liquid product material 118 is removed or solid product material 103 is added and more heat is added to the supply crucible 111 to maintain the amount of liquid supply material 113. The increase in heat added to the supply crucible surface 114 would cause the liquid temp near the heated supply crucible surface 114 to rise, and this would begin to raise the temperature overall through mixing and conduction. As this temperature increase reaches the solid product material 103, it begins to melt, effectively using up heat and preventing more temperature rise.

Figure 8:
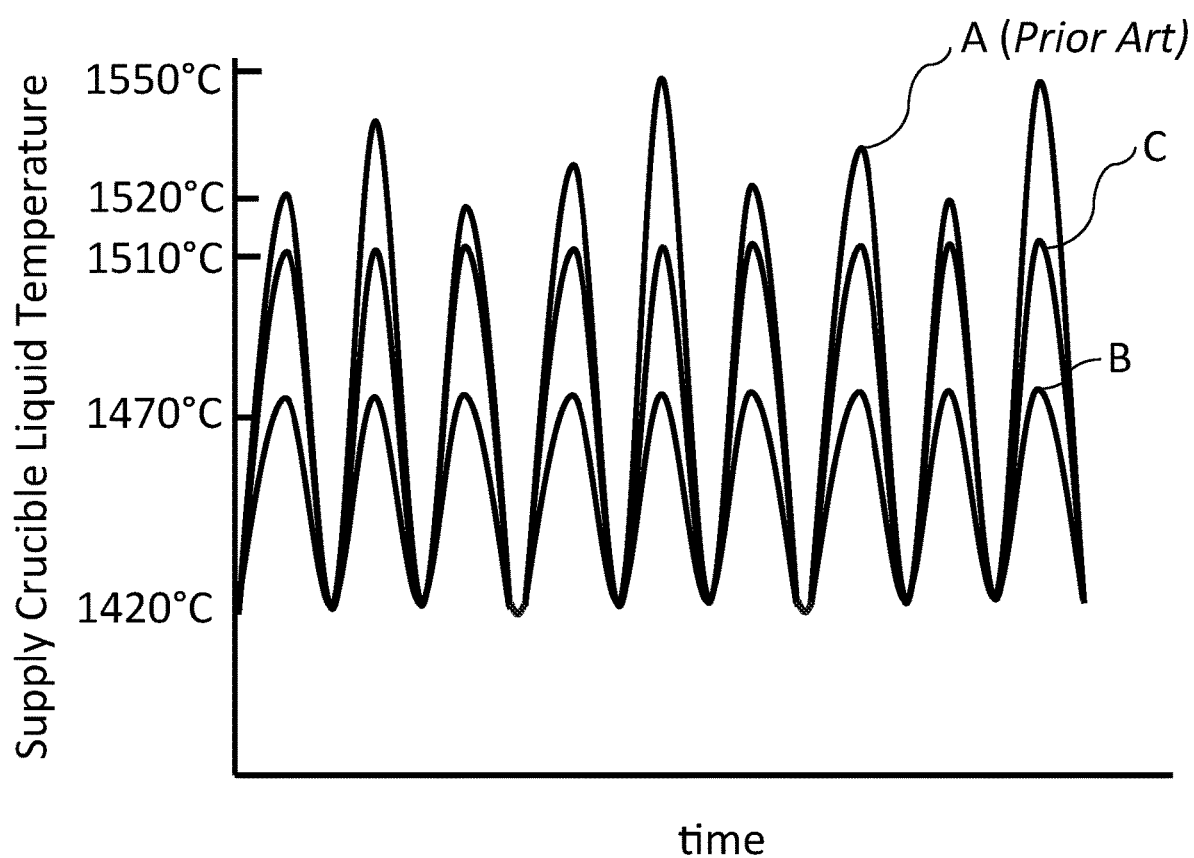
FIG. 8 shows schematically, in graphical form, a comparison of potential temperature excursions in a supply crucible with which a prior art method is used, as compared to in a supply crucible with which a method of an invention hereof is used, maintaining a solid phase of product material in the supply crucible, showing smaller temperature excursions with use of an embodiment of an invention hereof.

However, as shown schematically with reference to FIG. 8, these temperature excursions are much smaller, as compared to a prior art case where feedstock is completely melted in a supply crucible. FIG. 8 compares, schematically, a prior art situation (Curve A) with two situations representing embodiments of method inventions hereof (Curves B and C). The vertical scale shows the temperature in the liquid product material within a supply crucible, for instance at location L of FIG. 5. For the prior art curve A, the temperature would be taken at a corresponding location of a supply crucible, near to its exit. The horizontal scale is time.

FIG. 8, shows situations in which the range of temperature overshoot experienced with inventions hereof is reduced by up to 50% or more as compared to prior art methods. It is important to keep in mind that the size of the excursions depend on the variables listed above. FIG. 8 uses as an example a product material of silicon, which has a melting temperature of 1414° C. To ensure that the silicon not freeze up, attempts are made at all times to keep the target process temperature of the liquid silicon is kept at 1420° C. or higher. Curve A (the upper curve) shows a typical variation in temperature of liquid product material in a supply crucible using methods of the prior art, without maintenance of solid material. The temperature ranges from 1420° C., overshooting up to 1520° C. and even higher. In the case of prior art curve A, the cycles shown correspond schematically to the removal of liquid from the supply crucible, the addition of new solid product material feedstock, and the overshoot of the melt temperature as the power to the heaters is increased to quickly melt all of the newly supplied solid product material feedstock.

In the cases of curves B and C, the cycles shown correspond schematically to the removal of liquid from the supply crucible, the slow, continuous addition of new solid product material feedstock into the supply crucible from above, as solid material within it melts as discussed above. In the case of slow, continuous addition of liquid product material 118 to the main crucible 11, there may not be a need for a heater power cycle, unless by cycling the heater and generating more liquid is how the operator causes the liquid material 118 to flow from the supply crucible 111 to the main crucible 11. In cases where the solid product material 103 is added in batches there will need to be a heater cycle to melt the solid particles 103 and maintain liquid level 115.

Curve B (the lowest curve) shows the temperature situation during the practice of an embodiment of a method invention hereof, in the liquid product material 113 of a supply crucible 111. By keeping a quantity of solid phase product material 103 of feedstock in the supply crucible 111, the temperature excursions are significantly reduced, with the reduction in overshoot depending on the rate at which the liquid product material 118 is removed from the quantity of liquid product material 113 in the supply crucible 111 and added to the main crucible 11. This corresponds to the number of products made, and thus the reduction in volume of liquid 13 in the main crucible 11 (i.e., the number of wafers made between additions of liquid 117), the volume of the supply crucible 111, the control of the heater, the thermal response of the heater/crucible system, and the particle size of the solid product material 103 feedstock, among other factors.

Curve B shows temperature excursions over a range of approximately 50° C., from 1420° C. to approximately 1470° C. This is a relatively smaller excursion range as compared to that shown in the prior art curve A, and represents a reduction in the temperature excursion from 100° C. (Curve A) to only 50° C. This is considered an advantageously small temperature excursion. In fact, it is very advantageous.

Curve C (the middle curve) shows temperature excursions over a range of 90° C., from 1420° C. to approximately 1510° C. This is a relatively smaller excursion range as compared to the 100° C. shown in the prior art curve A, but it is larger than that shown incurve B. Curve C represents a reduction in the temperature excursion from 100° C. (Curve A) to only 90° C. Even though this is only a 10° C. improvement over the prior art, such a reduction in temperature excursion provides process advantages, and this is considered an advantageously small temperature excursion.

If the situation were an equilibrium one, where the rate of heating were unimportant, then the bulk liquid product material temperature in the supply crucible 111 would be very close to or at the melting point of the feedstock.

However, because in an operating situation, the solid product material 103 must be melted within a certain amount of time to maintain furnace throughput, temperature gradients within the liquid product material 113 in the supply crucible 111 will occur, but will be significantly damped, as compared to the prior art case where the solid feedstock material in the supply crucible is allowed to completely melt. For a given set of furnace parameters, if the supply crucible material is allowed to fully melt, then temperature overshoot can occur as shown in the first line of table 1, below. The actual overshoot depends on several variables, including the solid product material, volume of solid product material (and variability in such volume from run to run), solid product material particle size (and variability of such particle size from run to run), heater/crucible system thermal response, and heater control algorithm.

The reason that variability in volume and particle size from run to run contribute to overshoot is that if the system/furnace is expecting a certain volume of solid product material, or a certain particle size, then it will be set up to melt that expected volume or particle size within the required time period. If there is less volume, or if the particles are smaller, then the material will be melted more quickly, and there will be an overshoot in temperature. If the variations are in the opposite direction, melting will take longer, and there will be less of an overshoot, but, perhaps, the throughput requirements of the system will not be met. Thus, it is likely that biases will be to error on the side of variables that result in temperature overshoot, rather than inadequate throughput.

Table 1 shows the liquid temperature overshoot amount to be 100° C. That corresponds with Curve A of FIG. 8. Using the two phase approach as described herein provides the benefit of significantly reducing the given temperature overshoot to an advantageously small overshoot, reducing it by 10% as in case I. More preferably, it reduces the overshoot by 25% as in case II, which is also an advantageously small overshoot, being even smaller than the 10% overshoot. Most advantageously, it reduces the overshoot by 50% as in case III. Case I corresponds to the situation shown with Curve C in FIG. 8. Case III corresponds to the situation shown with Curve B in FIG. 8. The two phase method of inventions disclosed herein will provide an advantage over the one phase prior art methods, reducing the temperature overshoot in a corresponding manner, even if the one phase overshoot is different from 100° C. The actual reduction in overshoot, in either absolute degrees C. or percentage of overshoot will depend on the actual processes under consideration.

TABLE 1

| Case | Minimum supply crucible temp ° C. | Maximum supply crucible temp ° C. | Temp range (overshoot) ° C. | Reduction in Range % |
|---|---|---|---|---|
| prior art | 1420 | 1520 | 100 | |
| 2 phase I | 1420 | 1510 | 90 | 10% |
| 2 phase II | 1420 | 1495 | 75 | 25% |
| 2 phase III | 1420 | 1470 | 50 | 50% |

Another important advantage of always maintaining solid product material 103 in the supply crucible 111 is that the variation in the temperature excursions above the target process temperature or the equilibrium melting temperature is much smaller than as compared to the prior art method in which the product material is melted entirely and no effort is made to maintain solid product material 103 in the supply crucible. As shown in FIG. 8, the prior art curve A shows fluctuations in the maximum temperature excursion of up to from 1520° C. to as high as approximately 1550° C. The variability is due to many factors, including the need to provide relatively more power to the heaters, uncertainty as to the actual amount of solid product material provided to the supply crucible per charge, uncertainty as to the actual amount of liquid removed from the supply crucible at each liquid removal event, the actual average particle size or solid product material added at each charge. In practice, these parameters vary. Therefore, it is difficult to introduce the correct heater power with every charge of solid product material, resulting not only in temperature overshoot in the supply crucible, but also in the variability of temperature overshoot from cycle to cycle. This presents a negative result with a high volume throughput, high yield process. By practicing method inventions hereof and always keeping two phases, solid and liquid product material in the supply crucible, liquid temperature variation is maintained at a relatively low amount, and is, in any case, reduced from that experienced in the case where all of the solid material is melted. It should be noted that curves B and C shown in FIG. 8 are idealized, in that they show no variation from cycle to cycle in the maximum temperature excursion above the melting temperature. In practice, there would likely be some. However, it is much less than that experienced with the prior art method, for the reasons discussed above. There is less uncertainty. The added heat is always being used to melt solid material, and is never left to heat the liquid unimpeded.

The foregoing has discussed the temperature excursions of the prior art fully melted methods as compared to the present two phase methods in terms of the absolute overshoot in degrees C. above the equilibrium melt temperature, or, actually, over the safe, slightly higher, target process temperature. In the case of a silicon system, which has wide industrial applications, the overshoot experienced by prior art methods has been experienced to be typically between a minimum of the safe target process temperature of 1420° C. (the target process temperature) and at least 1500° C., and as much as 1550° C. This is an overshoot of at least 80° C., and sometimes as much as 130° C. The methods of inventions disclosed herein are able to maintain the temperature overshoots above 1420° C. generally to lower than 1490° C., and typically to as low as 1480° C. and in some cases as low as 1470° C. The method invention overshoot values thus are generally less than 70° C. (1490-1420); typically less than 60° C. (1480-1420) and may be as low as only 50° C. (1470-1420). The method invention overshoot values can be even less than 50° C. if more complicated heater control is applied.

Another way to characterize these overshoots is as a fractional multiple of the equilibrium melt temperature E of the material in question, for instance, silicon, $E_s$ of 1414° C. In those terms, the prior art typical overshoot of 80° C. is $0.06E_s$, and the occasional overshoot of 130° C. is $0.09E_s$. Thus, an expected range of overshoot for the prior art method is at least as much as $0.06E_s$, and possibly as much as $0.09E_s$.

In contrast, the method inventions hereof experience overshoots above equilibrium temperature of 70° C., which is only $0.05E_s$; of 60° C., which is only $0.04E_s$; and of 50° C., which is only $0.034E_s$. It is an aspect of inventions hereof to achieve overshoots of temperature in the supply liquid product material of $0.05E_s$ and less, and certainly less than the prior art overshoot which is at least $0.06E_s$ and more typically higher.

Germanium is another useful semiconductor to which the method inventions disclosed herein can be applied. Germanium has a relatively high heat of fusion and an equilibrium melt temperature $E_g$ of 938° C. It is believed that similar benefits in smaller temperature overshoots using Germanium, for instance typically as low as $0.05E_g$ or 47° C. and down to as low as $0.034E_g$ or 32° C. can be achieved.

It is also helpful to consider the material from which the supply 111 and main 11 crucibles are made, and the effect thereof on the purity of the liquid product material 13 in the main crucible 11, especially in the context of forming products from molten silicon, as an example. Both crucibles can be made from the same material or different. The material can be from a group of materials able to retain molten silicon, such as graphite, silica, silicon carbide, silicon nitride, quartz (silicon dioxide) and others. All of these materials are slightly soluble in molten silicon, with higher solubility at higher temperatures of the liquid silicon. If there is only liquid phase product material 113 in the supply crucible 111, as in practice of a prior art method, and temperature overshoots are large, crucible components, such as carbon (for graphite or silicon carbide crucibles), oxygen (for quartz crucibles), nitrogen (for silicon nitride crucibles), etc., would be dissolved at greater concentrations than would arise near the equilibrium melting temperature. When this high temperature liquid is poured into the liquid 13 of the main crucible 11, which liquid 13 is at a lower temperature, and the overall temperature of the hotter liquid that has just been added is reduced, the dissolved impurities in that formerly hotter liquid would precipitate, resulting in inclusions of such impurities within the product formed from the liquid product material in the main crucible, i.e., silicon wafers. This would be undesirable. Using methods of inventions disclosed herein, the temperature excursion in the supply crucible 111 are not as high, and thus, the solubility of the impurities from the supply crucible 111 and the atmosphere are not as high as in the case with the higher temperature excursions, and thus the formed products experience fewer impurities.

As FIG. 8 shows, even using the two-phase methods of inventions hereof, there may be some temperature within the liquid 113 in the supply crucible 111. If necessary, any or all of the methods known in the art discussed above to minimize temperature gradients, including but not limited to, rotating the crucible or tilting it back and forth to encourage mixing, bubbling gas through the liquid to encourage mixing, can be used.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

For instance, the invention of always maintaining at least some solid and at least some liquid product material in the supply crucible can be used for any sort of semiconductor material, including but not limited to silicon and germanium. It can be used with any sort of solid product material supply arrangement, including but not limited to direct manual supply, intervallic (either regular periodic or irregular) bulk supply of solid product material particles, continuous conveyor belt or other conveyor system that provides a uniform stream of solid product material to the supply crucible. It may be used with product materials that either are or are not subject to poor performance in the presence of carbides or other compounds that result from deposits on the crucible or within the furnace and high temperature excursions. The fluidic couple from the supply crucible to the main crucible can be a simple open pour out, as shown in FIG. 5, or one that is moderated by a weir, which may be either fixed or movable. The fluidic couple can be either in whole or in part closed pipes or open channels or combinations thereof, and also in combination with an open pour out as shown in FIG. 5.

Some assemblies of hardware, or groups of steps, may be referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

ASPECTS OF INVENTIONS

The following aspects of inventions hereof are intended to be described herein, and this section is to ensure that they are mentioned. They are named aspects, and although they appear similar to claims, they are not claims. However, at some point in the future, the applicants reserve the right to claim any and all of these aspects in this and any related applications.

A1. A method for maintaining a volume of liquid semiconductor product material in a main crucible, the method comprising:

a. providing a main crucible that contains liquid semiconductor product material, the semiconductor product material having an equilibrium melting temperature;

b. providing a supply crucible, and a fluid couple, which couples the supply crucible to the main crucible;

c. providing in the supply crucible, semiconductor product material in both liquid phase and solid phase;

d. maintaining the supply crucible so that both a liquid phase of semiconductor product material and a solid phase of semiconductor product material are present in the supply crucible;

e. removing from the main crucible, at least one aliquot of semiconductor product material, one aliquot at a time, over a period of time; and f. after at least one aliquot of semiconductor product material has been removed from the main crucible, adding liquid semiconductor product material to the main crucible from the supply crucible via the fluid couple.

A2. The method of aspect 1, the step of maintaining the supply crucible so that both a liquid phase of semiconductor product material and a solid phase of semiconductor product material are present in the supply crucible comprising adding solid semiconductor product material to the supply crucible.

A3. The method of any one of aspects 1-2, further comprising repeating steps d and e at least one more time to remove from the main crucible at least one additional aliquot of semiconductor product material.

A4. The method of any one of aspects 2-3, preceding the step of adding solid semiconductor product material to the supply crucible, the step of choosing additional product material so that upon addition of the additional solid semiconductor product material to the supply crucible, the temperature of the liquid phase semiconductor product material in the supply crucible remains within an advantageously small range of difference above the product material equilibrium melting temperature.

A5. The method of aspect 4, preceding the step of adding solid product material to the supply crucible, the step of choosing a volume of solid product material so that the temperature of the liquid phase product material in the supply crucible remains within an advantageously small range of difference above the product material equilibrium melting temperature.

A6. The method of aspect 4, preceding the step of adding additional product material to the supply crucible, the step of choosing solid product material having an average particle size so that the temperature of the liquid phase product material in the supply crucible remains within an advantageously small range of difference above the product material equilibrium melting temperature.

A7. The method of any one of aspects 1-6, the step of removing at least one aliquot of semiconductor product material from the main crucible comprising forming a semiconductor wafer directly from the liquid semiconductor material in the main crucible and removing the formed wafer from the main crucible.

A8. The method of any one of aspects 1-7, the supply crucible being arranged gravitationally above the main crucible, so that the supply fluid couple between the supply crucible and the main crucible is gravitational, achieved by pouring liquid semiconductor product material from the supply crucible to the main crucible.

A9. The method of aspect 8, the step of adding liquid semiconductor product material to the main crucible from the supply crucible via the fluid couple comprising providing heat to the supply crucible to melt solid semiconductor product material, thereby raising the level of liquid semiconductor material in the supply crucible so that liquid semiconductor material flows out of the supply crucible.

A10. The method of any one of aspects 1-9, the step of adding liquid semiconductor product material to the main crucible from the supply crucible via the fluid couple comprising pumping liquid semiconductor material from the supply crucible via the fluidic couple to the main crucible.

A11. The method of aspect 2, the step of adding solid semiconductor product material comprising providing solid semiconductor product material continuously.

A12. The method of aspect 2, the step of adding solid semiconductor product material comprising providing solid semiconductor product material in batches.

A13. The method of aspect 2, the step of adding solid semiconductor product material comprising providing solid semiconductor product material via a conveyor system.

A14. The method of aspect 2, the step of adding solid semiconductor product material comprising providing a hopper containing solid semiconductor product material, the hopper having a first, relatively large opening and a second, relatively smaller opening, the hopper arranged so that the smaller opening is adjacent the liquid phase semiconductor product material in the supply crucible.

A15. The method of aspect 14, the hopper comprising a funnel.

A16. The method of aspect 14, further comprising the step of adding solid semiconductor product material to the hopper while previously provided solid product material remains in the hopper.

A17. The method of any one of aspects 1-16, the semiconductor product material comprising silicon.

A18. The method of any one of aspects 2-17, the semiconductor product material comprising silicon.

A19. The method of aspect 18, further comprising, preceding the step of adding semiconductor product material to the supply crucible, the step of choosing additional semiconductor product material so that the difference between the temperature of the liquid phase product material in the supply crucible remains less than 0.05 times the product material equilibrium melting temperature plus the product material equilibrium melting temperature.

A20. The method of aspect 18, further comprising, preceding the step of adding semiconductor product material to the supply crucible, the step of choosing additional semiconductor product material so that the difference between the temperature of the liquid phase product material in the supply crucible remains less than 0.04 times the product material equilibrium melting temperature plus the product material equilibrium melting temperature.

A21. The method of aspect 18, further comprising, preceding the step of adding semiconductor product material to the supply crucible, the step of choosing additional semiconductor product material so that the difference between the temperature of the liquid phase product material in the supply crucible remains less than 0.034 times the product material equilibrium melting temperature plus the product material equilibrium melting temperature.

A22. The method of aspect 4, the product material equilibrium melting temperature being 1414° C., the advantageously small range of difference being 6° C.-90° C.

A23 The method of aspect 4, the product material equilibrium melting being 1414 C, the advantageously small range of difference being 6° C.-75° C.

A24 The method of aspect 4, the product material equilibrium melting being 1414° C., the advantageously small range of difference being 6° C.-50° C.

A25. The method of aspect 1, the semiconductor product material being selected from the group consisting of n-doped germanium and p-doped germanium.

A26. The method of aspect 1, the semiconductor product material being selected from the group consisting of n-doped silicon and p-doped silicon.

A27. The method of aspect 2, the step of adding solid semiconductor product material comprising adding particles having a diameter of at least 40 mm.

A28. The method of aspect 2, the step of adding solid product material comprising adding particles having a diameter of at least 15 mm.

A29. The method of aspect 2, the step of adding solid product material comprising adding particles having a diameter of at least 10 mm.

A30. A method for maintaining a volume of liquid silicon in a main crucible, the method comprising:
a. providing a main crucible that contains liquid silicon, the silicon having an equilibrium melting temperature;
b. providing a supply crucible, which is selectively fluidically coupled to the main crucible;
c. providing in the supply crucible, silicon in both liquid phase and solid phase;
d. maintaining the supply crucible so that both a liquid phase and a solid phase of silicon are present in the supply crucible;
e. removing from the main crucible, at least one aliquot of silicon, one aliquot at a time, over a period of time; and
f. after at least one aliquot of silicon has been removed from the main crucible, adding liquid silicon to the main crucible from the supply crucible via the fluid couple.

Having described the inventions disclosed herein, what is claimed is:

1. A method for maintaining a volume of liquid semiconductor product material in a main crucible, the method comprising:
a. providing a main crucible that contains liquid semiconductor product material, the semiconductor product material having an equilibrium melting temperature;
b. providing a supply crucible, and a fluid couple, which couples the supply crucible to the main crucible;
c. providing in the supply crucible, semiconductor product material in both liquid phase and solid phase;
d. maintaining the supply crucible so that both a liquid phase of semiconductor product material and a solid phase of semiconductor product material are present in the supply crucible, such that a temperature of the liquid phase semiconductor product material in the supply crucible is maintained above but within 90° C. of the semiconductor product material equilibrium melting temperature;
e. removing from the main crucible, at least one aliquot of semiconductor product material, one aliquot at a time, over a period of time; and
f. after at least one aliquot of semiconductor product material has been removed from the main crucible, adding liquid semiconductor product material to the main crucible from the supply crucible via the fluid couple;
wherein the step of maintaining comprises maintaining the supply crucible so that both the liquid phase of semiconductor product material and the solid phase of semiconductor product material are always present in the supply crucible during steps e and f.

2. The method of claim 1, the step of maintaining the supply crucible so that both a liquid phase of semiconductor product material and a solid phase of semiconductor product material are present in the supply crucible comprising adding solid semiconductor product material to the supply crucible.

3. The method of claim 2, further comprising repeating steps e and f at least one more time to remove from the main crucible at least one additional aliquot of semiconductor product material.

4. The method of claim 2, preceding the step of adding solid semiconductor product material to the supply crucible, the step of choosing additional solid semiconductor product material so that upon addition of the additional solid semiconductor product material to the supply crucible, the temperature of the liquid phase semiconductor product material in the supply crucible remains within an advantageously small range of difference above the semiconductor product material equilibrium melting temperature, wherein the advantageously small range of difference is 90° C. or less.

5. The method of claim 4, preceding the step of adding solid semiconductor product material to the supply crucible, the step of choosing a volume of solid semiconductor product material so that the temperature of the liquid semiconductor product material in the supply crucible remains within the advantageously small range of difference above the semiconductor product material equilibrium melting temperature.

6. The method of claim 4, preceding the step of adding solid semiconductor product material to the supply crucible, the step of choosing solid semiconductor product material having an average particle size so that the temperature of the liquid semiconductor product material in the supply crucible remains within the advantageously small range of difference above the semiconductor product material equilibrium melting temperature.

7. The method of claim 1, the step of removing at least one aliquot of semiconductor product material from the main crucible comprising forming a semiconductor wafer directly from the liquid semiconductor material in the main crucible and removing the formed wafer from the main crucible.

8. The method of claim 1, the supply crucible being arranged gravitationally above the main crucible, so that the supply fluid couple between the supply crucible and the main crucible is gravitational, achieved by pouring liquid semiconductor product material from the supply crucible to the main crucible.

9. The method of claim 8, the step of adding liquid semiconductor product material to the main crucible from the supply crucible via the fluid couple comprising providing heat to the supply crucible to melt solid semiconductor product material, thereby raising the level of liquid semiconductor material in the supply crucible so that liquid semiconductor material flows out of the supply crucible.

10. The method of claim 1, the step of adding liquid semiconductor product material to the main crucible from the supply crucible via the fluid couple comprising pumping liquid semiconductor material from the supply crucible via the fluidic couple to the main crucible.

11. The method of claim 2, the step of adding solid semiconductor product material comprising providing solid semiconductor product material continuously.

12. The method of claim 2, the step of adding solid semiconductor product material comprising providing solid semiconductor product material in batches.

13. The method of claim 2, the step of adding solid semiconductor product material comprising providing solid semiconductor product material via a conveyor system.

14. The method of claim 2, the step of adding solid semiconductor product material comprising providing a hopper containing solid semiconductor product material, the hopper having a first, relatively large opening and a second, relatively smaller opening, the hopper arranged so that the smaller opening is adjacent the liquid phase semiconductor product material in the supply crucible.

15. The method of claim 14, the hopper comprising a funnel.

16. The method of claim 14, further comprising the step of adding solid semiconductor product material to the hopper while previously provided solid semiconductor product material remains in the hopper.

17. The method of claim 2, the semiconductor product material comprising silicon.

18. The method of claim 17, further comprising, preceding the step of adding semiconductor product material to the supply crucible, the step of choosing additional semiconductor product material so that the difference between the temperature of the liquid phase semiconductor product material in the supply crucible remains less than 0.05 times the semiconductor product material equilibrium melting temperature plus the semiconductor product material equilibrium melting temperature.

19. The method of claim 17, further comprising, preceding the step of adding semiconductor product material to the supply crucible, the step of choosing additional semiconductor product material so that the difference between the temperature of the liquid phase semiconductor product material in the supply crucible remains less than 0.04 times the semiconductor product material equilibrium melting temperature plus the semiconductor product material equilibrium melting temperature.

20. The method of claim 17, further comprising, preceding the step of adding semiconductor product material to the supply crucible, the step of choosing additional semiconductor product material so that the difference between the temperature of the liquid phase semiconductor product material in the supply crucible remains less than 0.034 times the semiconductor product material equilibrium melting temperature plus the semiconductor product material equilibrium melting temperature.

21. The method of claim 4, the semiconductor product material equilibrium melting temperature being 1414° C., the advantageously small range of difference being 6° C.-90° C.

22. The method of claim 4, the semiconductor product material equilibrium melting being 1414 C, the advantageously small range of difference being 6° C.-75° C.

23. The method of claim 4, the semiconductor product material equilibrium melting being 1414° C., the advantageously small range of difference being 6° C.-50° C.

24. The method of claim 1, the semiconductor product material being selected from the group consisting of n-doped germanium and p-doped germanium.

25. The method of claim 1, the semiconductor product material being selected from the group consisting of n-doped silicon and p-doped silicon.

26. The method of claim 2, the step of adding solid semiconductor product material comprising adding particles having a diameter of at least 40 mm.

27. The method of claim 2, the step of adding solid product material comprising adding particles having a diameter of at least 15 mm.

28. The method of claim 2, the step of adding solid product material comprising adding particles having a diameter of at least 10 mm.

29. A method for maintaining a volume of liquid silicon in a main crucible, the method comprising:
  a. providing a main crucible that contains liquid silicon, the silicon having an equilibrium melting temperature;
  b. providing a supply crucible, which is selectively fluidically coupled to the main crucible;
  c. providing in the supply crucible, silicon in both liquid phase and solid phase;
  d. maintaining the supply crucible so that both a liquid phase and a solid phase of silicon are present in the supply crucible such that a temperature of the liquid phase of silicon in the supply crucible is maintained above but within 90° C. of the 1414° C. equilibrium melting temperature of silicon;
  e. removing from the main crucible, at least one aliquot of silicon, one aliquot at a time, over a period of time; and
  f. after at least one aliquot of silicon has been removed from the main crucible, adding liquid silicon to the main crucible from the supply crucible via the fluid couple;
  wherein the step of maintaining comprises maintaining the supply crucible so that both the liquid phase and the solid phase of silicon are always present in the supply crucible during steps e and f.

* * * * *